United States Patent [19]
Sugaya

[11] Patent Number: 5,936,253
[45] Date of Patent: Aug. 10, 1999

[54] POSITION DETECTOR AND MICROLITHOGRAPHY APPARATUS COMPRISING SAME

[75] Inventor: Ayako Sugaya, Kawasaki, Japan

[73] Assignee: Nikon Corporation, Tokyo, Japan

[21] Appl. No.: 08/984,123

[22] Filed: Dec. 3, 1997

[30] Foreign Application Priority Data

Dec. 5, 1996 [JP] Japan ................................ 8-340652

[51] Int. Cl.[6] .......................... H01L 27/027; G03B 27/72
[52] U.S. Cl. .............................. 250/548; 356/400; 355/53
[58] Field of Search .................. 250/548; 356/399–401; 355/53, 55

[56] References Cited

U.S. PATENT DOCUMENTS

| | | | |
|---|---|---|---|
| 5,621,500 | 4/1997 | Shiraishi | 355/53 |
| 5,684,569 | 11/1997 | Sugaya et al. | |
| 5,767,949 | 6/1998 | Noguchi et al. | 355/53 |
| 5,783,833 | 7/1998 | Sugaya et al. | 250/548 |

FOREIGN PATENT DOCUMENTS

| | | |
|---|---|---|
| 3-27515 | 2/1991 | Japan . |
| 07183186 | 7/1995 | Japan . |

*Primary Examiner*—Stephone Allen
*Attorney, Agent, or Firm*—Klarquist Sparkman Campbell Leigh & Whinston, LLP

[57] ABSTRACT

Position detectors are disclosed for reliable, high-accuracy detection of alignment marks on a wafer, including alignment marks consisting of small phase steps. The position detector comprises a phase plate located conjugate to an aperture stop. The phase plate produces a phase shift between the undiffracted light flux from the alignment marks and the diffracted light flux and a phase-contrast image is of the alignment marks is formed. The phase plate is switchable or insertable so that a bright-field image is also obtainable. Bright-field images and phase-contrast images are directly viewable or are received by one or more image sensor. A signal processor receives image signals from the image sensors and determines the position of the alignment marks. The sensor then provides a position signal that is used to move the wafer and reticle into alignment.

29 Claims, 5 Drawing Sheets

POSITION DETECTOR AND MICROLITHOGRAPHY APPARATUS COMPRISING SAME

FIELD OF THE INVENTION

The invention pertains to a position detector for measuring the position of a substrate with respect to a mask or reticle.

BACKGROUND OF THE INVENTION

In semiconductor microlithography, circuit patterns from a mask or a reticle are projected onto a sensitized surface of a wafer. The mask and a wafer are aligned so that the appropriate areas of the wafer are exposed to the corresponding circuit patterns. In addition, the mask and wafer must be aligned so that patterns from multiple exposures are accurately registered.

The alignment of the mask and wafer is typically determined using a position detector that measures the relative positions of the mask and reticle using alignment marks on the wafer. Some position detectors operate according to a Field Image Alignment ("FIA") system. In an FIA system, alignment marks are illuminated with a broadband light flux from a light source such as a halogen lamp. The alignment marks are then imaged onto a light sensitive surface of an image sensor such as a CCD and the position of the alignment marks is determined by processing the image signal from the image sensor.

The alignment marks are generally patterns formed on the wafer by a patterned metal or insulating layer. These layers can be as thin as about 10 nm and can be as thick as about 1 $\mu$m. The position measurements obtained with FIA alignment sensors tend to be inaccurate because the images of the alignment marks have low contrast. Images of alignment marks formed of very thin layers of an insulator have particularly poor image contrast.

FIA position detectors that have improved position accuracy, even with alignment marks made of thin layers of an insulator, have been disclosed in Japanese laid-open patent documents HEI 3-27515 and HEI 7-183186. The alignment sensor of Japanese patent document HEI 7-183186 detects the position of such alignment marks by defocusing the image of the alignment marks. Consequently, alignment errors are caused by the tilt of the chief ray with respect to the optical axis. To correct this error, the tilt of the chief ray (the deviation from telecentricity) must be measured.

The alignment sensor of Japanese patent document HEI 3-27515 uses bright-field imaging to image thick-layer alignment marks while the thin-layer alignment marks are imaged using phase-contrast imaging. In order to switch from bright-field imaging of thick layers to phase-contrast imaging of thin layers, the aperture stop of the illumination system is removed and a phase plate is inserted into the imaging optical system. As a result, it is difficult to maintain optimum imaging conditions for both bright-field and phase-contrast imaging.

In addition, because the illumination conditions are changed by removing the aperture stop, switching from bright-field to phase-contrast imaging changes the aberration balance in the image. In bright-field imaging with a large illumination numerical aperture, the illumination light flux nearly fills the entrance pupil so that image aberrations are determined primarily by the total aberrations of the pupil. However, in phase-contrast imaging the numerical aperture is smaller and the illumination light flux fills a only a small area of the entrance pupil. Image aberrations are determined only by this small area. As a result, it is difficult to maintain optimum imaging for both phase-contrast and bright-field imaging. Furthermore, the positioning of optical elements for phase-contrast imaging and bright-field imaging cannot generally be done independently so that image quality is degraded.

Some position detectors improve image contrast for thin alignment marks by providing a phase plate having an area of reduced transmittance. While such a phase plate improves image contrast, the imaged is formed with a reduced light flux intensity. The reduced flux intensity decreases the accuracy of alignment mark measurements done with conventional image sensors.

SUMMARY OF THE INVENTION

The invention provides, inter alia, position detectors that permit accurate, reliable position measurement and direct visual observation of alignment marks. Exposure devices for transferring patterns from a reticle to a sensitized wafer or other substrate are provided; such devices use the position detectors to align the reticle and the sensitized substrate. The position detector provides excellent imaging even for alignment patterns that provide a weak phase modulation of an alignment light flux.

A position detector according to a preferred embodiment of the invention comprises an illumination system that illuminates alignment marks on a wafer or other substrate. The illumination system comprises an aperture stop. The position detector further comprises an imaging system that images the alignment marks. The imaging system comprises an imaging aperture stop and a phase plate so that bright-field images and phase-contrast images can be formed. The imaging aperture stop and the phase plate are located conjugate to the aperture stop. The phase plate has a phase-shift region and a phase-plate aperture that change the relative phase of the portions of the alignment flux transmitted through the phase-shift region and the phase-plate aperture. A selector is provided that withdraws or inserts the phase plate to select bright-field or phase-contrast imaging.

The position detector also comprises an image sensor for receiving the bright-field image or the phase-contrast image. The image sensor provides an image signal to a signal processor that in turn produces a position signal based on the image signal. A controller is provided that receives the image signal and then adjusts the relative positions of the mask and reticle based on the position signal.

A reference-mark plate located conjugate to an image of the alignment marks is provided. In addition, the size of the aperture of the imaging aperture stop corresponds to the imaging numerical aperture. The size of the phase-shift region of the phase plate preferably corresponds to the size of the image of the aperture stop.

The aperture stop, the imaging aperture stop, and the phase-shift region are preferably circular. The phase-plate aperture is preferably a circular ring surrounding the phase-shift region. The phase-shift region and the phase-plate aperture each provide a phase shift of $\lambda/4$. In addition, the phase plate can be electrically adjustable to provided a selected phase shift, including zero phase shift.

A position detector according to a second embodiment of the invention comprises a bright-field optical system and a phase-contrast optical system. A switchable mirror is provided that is inserted to deflect the alignment flux to a selected optical system. In this embodiment, it is unnecessary to insert or withdraw the phase plate. An image sensor receives the alignment flux from either the bright-field or the phase-contrast optical system. Alternatively, two image sensors can be provided.

A position detector according to a third embodiment of the invention comprises a bright-field optical system and a phase-contrast optical system including the imaging aperture and the phase plate, respectively. An image sensor receives a bright-field image or a phase-contrast image, selected by blocking one of the optical systems with a shutter. Alternatively, two image sensors can be provided so that both images are simultaneously received.

A beamsplitter directs the alignment flux to the bright-field path or the phase-contrast path. The beamsplitter can be a polarizing beamsplitter or a dichroic beamsplitter and the alignment flux can be polarized or filtered prior to reaching the beamsplitter.

The present invention also encompasses exposure devices for transferring patterns on a reticle to a substrate. A preferred embodiment of the exposure device comprises a position detector having an illumination system that produces an alignment flux that illuminates alignment marks on the substrate. An imaging system is provided that forms bright-field images and phase-contrast images of the alignment marks. At least one of the images is used to control translation of the wafer or the reticle to achieve alignment.

The present invention also encompasses apparatus for observing alignment marks. A preferred embodiment comprises an illumination system that produces an alignment flux that illuminates the alignment marks. An imaging system having an imaging aperture and a phase plate forms bright-field or phase-contrast images of the alignment marks. The phase plate is located conjugate to the aperture stop and is insertable to produce a phase-contrast image.

The phase plate has a central phase-shift region having a transmission $T_1$ and a surrounding phase-shift aperture having a transmission $T_2$. The phase difference between the phase-shift region and the phase-plate aperture is $\lambda/4$. The transmissions preferably satisfy the conditions $T_1 > 0.7$ and $|T_1 - T_2| < 0.3$.

In the embodiments of the invention, the aperture stop is not removed or changed to switch from bright-field to phase-contrast imaging. Because the aperture stop is unchanged, illumination conditions are unchanged when switching from bright-field imaging to phase-contrast imaging. Consequently, the aberration balance of the imaging system does not vary, making additional aberration correction unnecessary. Because the phase plate is insertable independent of the aperture stop and the imaging aperture stop, bright-field imaging and phase-contrast imaging can be independently adjusted. Consequently, reliable, high-accuracy position detection (even of thin phase marks) is achieved.

The foregoing and other features and advantages of the invention will become more apparent from the following detailed description which proceeds with reference to the accompanying drawings.

DETAILED DESCRIPTION

Figure 1:
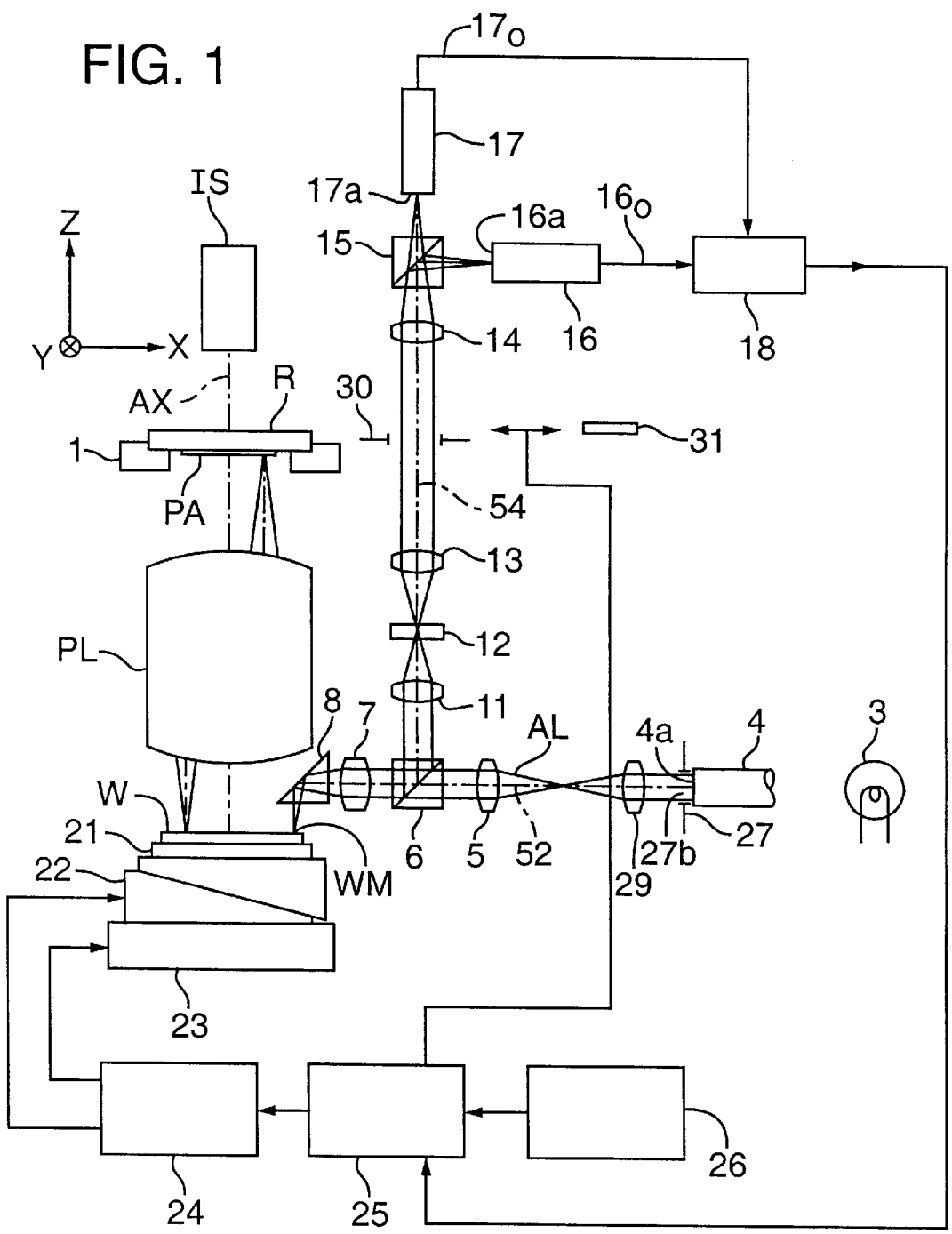
FIG. 1 is a schematic elevational view of microlithography apparatus equipped with a position detector in accordance with Example Embodiment 1.

The example embodiments disclosed herein are described with respect to an XYZ coordinate system that has a Z-axis parallel to an axis AX of a projection optical system PL of a microlithography apparatus (FIG. 1). An X-axis is selected that is perpendicular to the Z-axis as shown in FIG. 1. A Y-axis is selected that is perpendicular to both the X-axis and the Z-axis.

Example Embodiment 1

A microlithography apparatus according to the example embodiment, shown in FIG. 1, comprises an illumination system IS that produces a light flux of a suitable wavelength and intensity. The illumination system IS directs the light flux along the axis AX to uniformly illuminate a reticle R that defines circuit patterns to be projected onto a wafer W. A reticle stage 1 supports the reticle R so that the reticle R is substantially parallel to the XY-plane. The reticle R has a pattern area PA that contains the circuit patterns to be transferred to the wafer W. The light flux is transmitted by the reticle R to the projection optical system PL that images the pattern area PA of the reticle R onto the wafer W.

The wafer W is supported substantially parallel to the XY-plane by a wafer holder 21. The wafer holder 21 is connected to a Z-axis stage 22 that translates the wafer holder 21 along the Z-axis under the control of a stage controller 24. The Z-axis stage 22 is supported on an XY-stage 23 that is translatable in the XY-plane under the control of the stage controller 24.

The wafer W has alignment marks WM for alignment with the reticle R. A position detector comprises an alignment-illumination system that provides an alignment light flux AL with a broadband light source 3 such as a halogen lamp. The alignment-illumination system further comprises a light guide 4, an illumination aperture stop 27, a condenser lens 29, a relay lens 5, a beamsplitter 6, a first objective lens 7, and a reflecting prism 8. The light guide 4 receives the alignment flux AL and delivers the alignment flux AL to an exit end 4a of the light guide 4. The alignment flux AL propagates along an axis 52 and is restricted by the aperture stop 27 having a circular aperture 27b. The aperture stop 27 serves as the aperture stop of the alignment-illumination system and defines the illumination numerical aperture. The condenser lens 29 receives the alignment flux AL and focuses the alignment flux AL at a field stop (not shown in FIG. 1). The relay lens 5 then collimates the alignment flux AL.

The alignment flux AL is directed to the alignment marks WM by the beamsplitter 6 that directs a portion of the alignment flux AL to the first objective lens 7 and the reflecting prism 8. (Another portion of the alignment flux AL is reflected by the beamsplitter 6 and is not used.) The prism 8 then directs the alignment flux AL to the alignment marks WM on the wafer W.

The alignment marks WM are generally patterns formed on the wafer W by patterning a metal or insulating layer deposited specifically for facilitating alignment. The layer is usually 10–1000 nm thick. To form the alignment marks WM, the metal or insulating layer is deposited and a pattern is etched in the layer. The resulting alignment marks WM then have regions containing the metal or insulating layer as deposited and regions in which the deposited layer has been thinned or removed completely by etching. For convenience, alignment marks WM for which the thickness difference between etched and unetched regions of less than about 10–50 nm are referred to herein as "thin" alignment marks. Alignment marks WM with a larger height difference are referred to as "thick". In addition, pattern features on the reticle R can serve as alignment marks WM so that dedicated alignment marks WM are not needed.

An alignment-imaging system then images the alignment marks WM. A portion of the alignment flux AL is returned from the alignment marks WM back to the prism 8, the first objective lens 7, and the beamsplitter 6. The beamsplitter 6 directs the alignment flux AL returned from the alignment marks WM along an axis 54 to a second objective lens 11 that images the alignment marks WM at a reference-mark plate 12. Relay lenses 13, 14 then direct the alignment flux AL from the reference-mark plate 12 to a beamsplitter 15; an imaging aperture stop 30 is placed between the lenses 13, 14 at a location that is approximately conjugate with the aperture stop 27. The beamsplitter 15 reflects a portion of the alignment flux AL to a Y-direction CCD 16 and transmits a portion to an X-direction CCD 17. The relay lens 14 images the alignment marks WM and the reference-mark plate 12 onto photosensitive surfaces 16a, 17a of the charge-coupled device image sensors (CCDs) 16, 17, respectively. It will be apparent that image sensors other than CCDs can be used or that the images of the alignment marks can be directly observed using an eyepiece.

The Y-direction CCD 16 and the X-direction CCD 17 supply image signals via outputs $16_o$, $17_o$, respectively, to a signal processor 18. Based upon the image signals, the signal processor 18 evaluates the position of the alignment marks WM and supplies a position signal to a main controller 25.

The alignment marks WM may have various configurations. For example, the alignment marks WM may comprise two lines spaced periodically along an axis, or a two-dimensional pattern spaced periodically along two axes, e.g., the X-axis and the Y-axis. Alternatively, the alignment marks WM need not be periodic.

The main controller 25 evaluates the X- and Y-positions of the wafer W based on the position signal from the signal processor 18 and controls the stage controller 24 accordingly. The stage controller 24 directs the XY-stage 23 to align the wafer W. The Y-direction CCD 16, the X-direction CCD 17, the signal processor 18, and the main controller 25 thus constitute a position detector for determining the position of the wafer W based on image signals corresponding to images of the alignment marks WM.

In addition, the main controller 25 supplies a bright-field command or a phase-contrast command in response to an input from an input device 26 such as a keyboard or mouse. If a phase-contrast command is given, the main control system 25 directs the insertion of a phase plate 31 between the relay lenses 13, 14. The phase plate 31 is inserted near the aperture stop 30 and approximately conjugate to the aperture stop 27. If a bright-field command is given, the phase plate 31 is withdrawn. Bright-field images are generally preferred to phase-contrast images for alignment marks WM made with a thick metal or insulating layer; phase-contrast is generally preferable for alignment marks made with a thin metal or insulating layer, or for a thick metal or insulating layer that is not deeply etched.

Figure 2A:
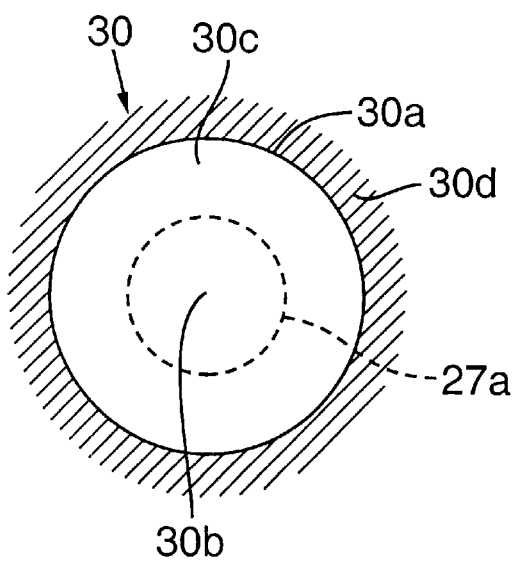
FIG. 2(a) is a schematic plan view of the imaging aperture stop of the position detector of FIG. 1.

With reference to FIG. 2(a), the aperture stop 30 comprises an aperture 30a. The aperture 30a comprises a circular aperture 30b surrounded by a circular ring aperture 30c, both centered on the axis 54. An opaque region 30d surrounds the circular ring aperture 30c. An image 27a of the aperture 27b of the illumination aperture stop 27 is formed at the aperture stop 30. An undiffracted ("0th-order") portion of the alignment flux AL is transmitted by the aperture 30b. If the alignment marks WM are large, then a diffracted portion of the alignment flux is transmitted by the circular ring aperture 30c. If the alignment marks are small, then a diffracted portion of the alignment flux AL is blocked by the opaque region 30d. Bright-field images of the alignment marks WM are formed at the CCDs 16, 17 and the position of the wafer W is determined based on the bright-field images. Bright-field images are particularly well-suited for alignment marks WM that are thick or absorbing.

Figure 2B:
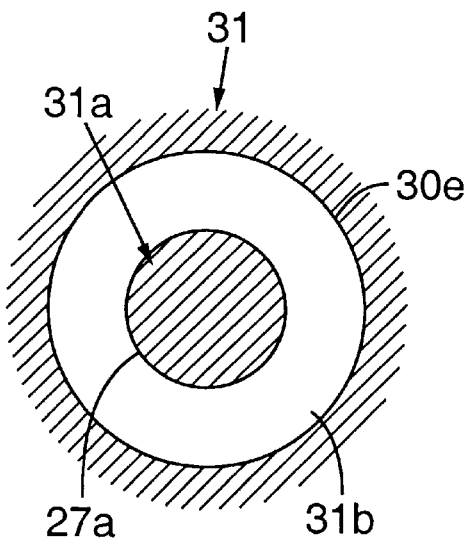
FIG. 2(b) is a schematic plan view of the phase plate of FIG. 1.

With reference to FIG. 2(b), the phase plate 31 defines a phase-shift region 31a and a phase-plate aperture 31b that is a circular ring surrounding the phase-shift region 31a. The phase-plate aperture 31b encompasses the area between the phase-shift region 31a and an aperture plate 30e. The phase-shift region 31a changes the relative phase of a light flux transmitted by the phase-shift region 31a with respect to a light flux transmitted by the aperture 31b. When the phase plate 31 is inserted by the main controller 25, the image 27a of the aperture stop 27 is formed on the phase-shift region 31a. Consequently, an undiffracted (0th-order) portion of the incident alignment flux AL is phase-shifted by the phase-shift region 31a. Another portion of the alignment flux AL from the alignment marks WM is transmitted by the aperture 31b. As a result, the phase plate 31 produces a phase difference between the portions of the alignment flux AL transmitted by phase-shift region 31a and the aperture 31b. It will be apparent that the phase plate 31 can be arranged so that the aperture 31b serves as a phase-shift region instead of the phase-shift region 31a. After the alignment flux is transmitted by the phase plate 31, a phase-contrast image of the alignment marks WM is formed on the photosensitive surfaces 16a, 17a of the CCDs 16, 17. The contrast of the phase-contrast images is greatest if the phase shift is $\pm \lambda/4$ ($\pm \pi/2$). Phase-contrast imaging is typically preferred for imaging thin alignment marks WM.

By selectably inserting the phase plate 31, either a bright-field image or a phase-contrast image is available. Thus, excellent images of both thick and thin alignment marks WM can be formed so that wafer position is accurately determined.

In Example Embodiment 1, the aperture stop 27 is centered on the optical axis AX, and the imaging aperture stop 30 is positioned to improve image quality of bright-field images of thick marks WM. In addition, the objective lens 7, which may comprise several lens elements, is adjusted by slightly moving one or more of the lens elements with respect to the axis 52 to further reduce image aberrations. Similarly, the phase plate 31 is optically adjusted to improve image quality in phase-contrast images of thin alignment marks WM. Because the aperture stop 27 is used by the alignment-illumination system for both bright-field and phase-contrast imaging, illumination conditions are unchanged by the selection of bright-field or phase-contrast imaging. Consequently, illumination conditions are unchanged by the selection of bright-field or phase-contrast imaging. In contrast, conventional systems require aberration correction or other optical adjustment to maintain image quality when switching from bright-field imaging to phase-contrast imaging.

As shown in FIG. 1, switching to phase-contrast imaging is simple, requiring only the insertion of the phase plate 31. While the phase plate 31 is readily inserted, an electrically adjustable phase plate can be used instead. With such a phase plate, the phase shift is electrically adjusted to a selected phase difference for phase-contrast imaging and electrically adjusted to zero phase difference for bright-field imaging.

Example Embodiment 2

Figure 3:
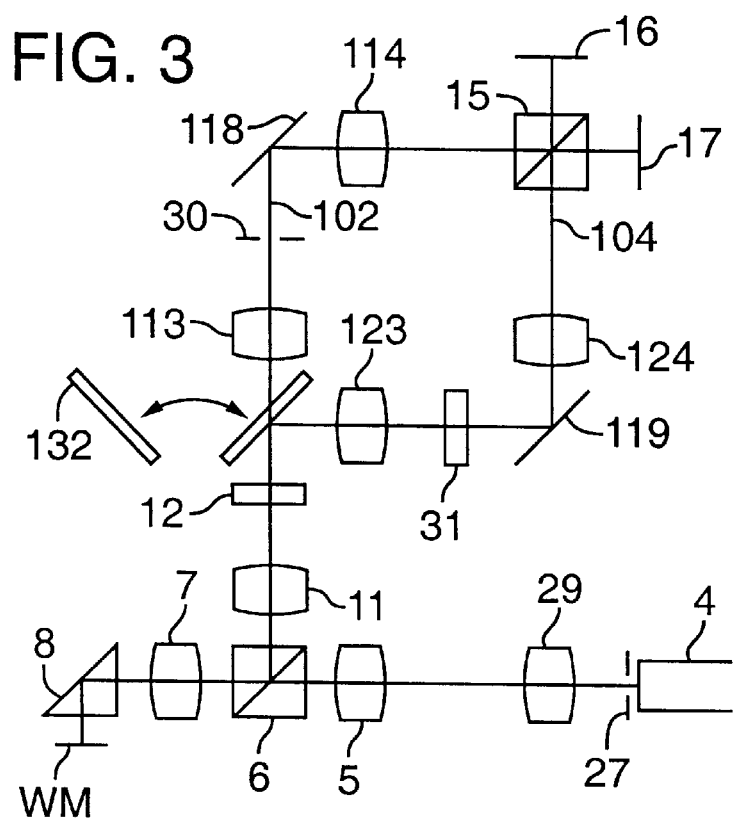
FIG. 3 is a schematic elevational view of a position detector according to Example Embodiment 2.

With reference to FIG. 3, a position detector according to Example Embodiment 2 comprises an insertable mirror 132 and is similar to the position detector of Example Embodiment 1. The alignment light flux AL exits the light guide 4 and is transmitted by the aperture stop 27, the lenses 5, 29, the beamsplitter 6, and the lens 7 to the prism 8 that directs the alignment flux AL to the alignment marks WM. The alignment flux AL from the alignment marks WM returns through the prism 8 and the lens 7 to the beamsplitter 6 that directs the alignment flux AL to the lens 11 and the reference-mark plate 12.

After transmission through the reference-mark plate 12, the alignment flux AL is directed to the insertable mirror 132. The mirror 132 is controlled by the main controller 25 to permit selection of bright-field imaging or phase-contrast imaging. If the mirror 132 is retracted for bright-field imaging, the alignment light flux AL from the alignment marks WM propagates along a bright-field optical path 102 to a relay lens 113, the imaging aperture stop 30, a turning mirror 118, and a relay lens 114. The imaging aperture stop 30 is located approximately conjugate to the aperture stop 27. The alignment flux AL enters a beamsplitter 115 that reflects a portion of the alignment light flux AL to a Y-direction CCD 116 and transmits a portion to an X-direction CCD 117. The CCDs 116, 117 receive images of the alignment marks WM.

When the mirror 132 is inserted for phase-contrast imaging, the alignment flux AL is reflected by the mirror 132 along a phase-contrast optical path 104. The alignment light flux AL is directed by a relay lens 123, the phase plate 31, a turning mirror 119, and a relay lens 124 to the beamsplitter 115. The phase plate 31 is located approximately conjugate to the aperture stop 27. A portion of the alignment light flux AL is then reflected to the Y-direction CCD 116 and another portion is transmitted to the X-direction CCD 117.

Bright-field imaging and phase-contrast imaging are selected by retracting and inserting the mirror 132 respectively. It will be apparent that optical adjustments for bright-field imaging and phase-contrast imaging are largely independent. In addition, because the relay lenses 113, 114 for bright-field imaging are different than the relay lenses 123, 124 for phase-contrast imaging, the relay lenses 123, 124 can compensate for errors such as manufacturing defects in the phase plate 31.

It will be apparent that the mirror 132 can be replaced with other switchable reflectors, such as an electrically switchable mirror that is electrically switchable between a transmitting and a reflecting state.

Example Embodiment 3

Figure 4:
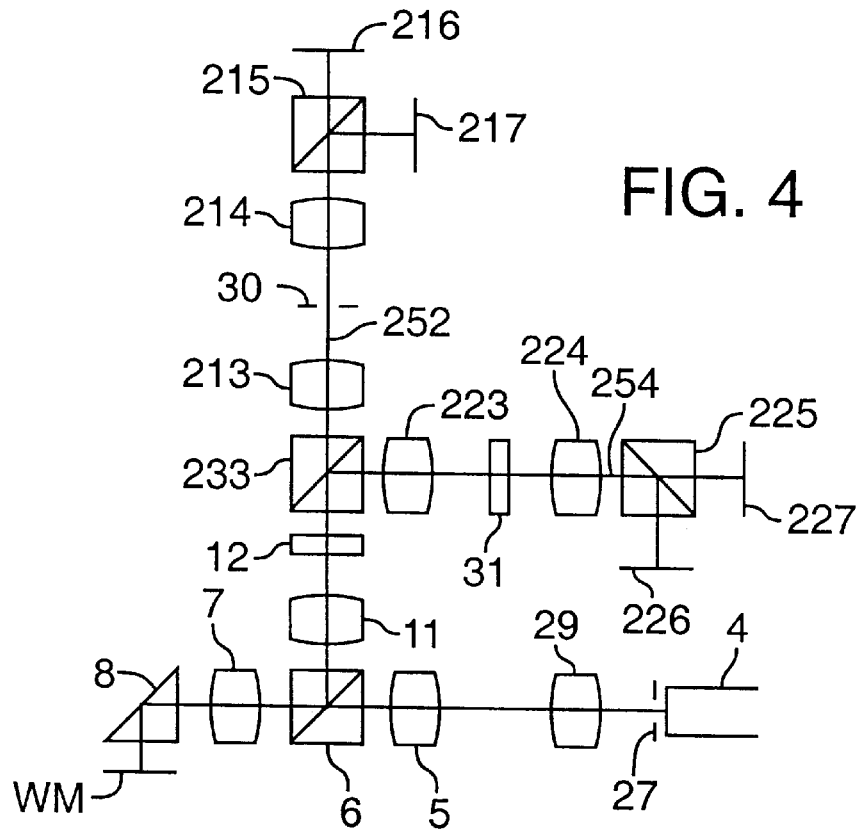
FIG. 4 is a schematic elevational view of a position detector according to Example Embodiment 3.

With reference to FIG. 4, a position detector according to Example Embodiment 3 comprises a beamsplitter 233. The alignment light flux AL exits the light guide 4 and is transmitted by the aperture stop 27, the lenses 5, 29, the beamsplitter 6, and the lens 7 to the prism 8 that directs the alignment flux AL to the alignment marks WM. The alignment flux AL from the alignment marks WM returns through the prism 8 and the lens 7 to the beamsplitter 6 that directs the alignment flux AL to the lens 11 and the reference-mark plate 12.

The alignment flux AL is then incident to the beamsplitter 233. The beamsplitter 233 transmits a portion of the alignment flux AL along an bright-field optical path 252 to a relay lens 213, the imaging aperture stop 30, a relay lens 214, and a beamsplitter 215. The imaging aperture stop 30 is approximately conjugate with the aperture stop 27. The beamsplitter 215 directs portions of the alignment flux AL to a Y-direction CCD 216 and an X-direction CCD 217. Bright-field images of the alignment marks WM are thus formed at the Y-direction CCD 216 and the X-direction CCD 217.

A portion of the alignment flux AL is reflected by the beamsplitter 233 along a phase-contrast optical path 254 through a relay lens 223, the phase plate 31, and a relay lens 224 to a beamsplitter 225. The phase plate 31 is located approximately conjugate to the aperture stop 27. A portion of the alignment flux AF is reflected by the beamsplitter 225 to the Y-direction CCD 226, while a transmitted portion is incident to an X-direction CCD 227. Phase-contrast images of the alignment marks WM are thus formed at the Y-direction CCD 226 and the X-direction CCD 227.

Position detection based on bright-field imaging or phase-contrast imaging is readily accomplished by selecting the CCDs 216, 217 or the CCDs 226, 227, respectively. In addition, a signal processor 218 is provided having inputs 237, 238 for bright-field image signals and 247, 248 for phase-contrast image signals, respectively. The signal processor 218 also provides bright-field and phase-contrast position signals to the main controller 25.

It will be apparent that the position detector of Example Embodiment 3 requires no adjustment of the optical system in switching from bright-field to phase-contrast imaging. There is no insertion or retraction of optical components and errors resulting from moving parts are eliminated. In addition, lenses and other optical components along the axes 252, 254 are independently selectable and adjustable.

Example Embodiment 4

Figure 5:
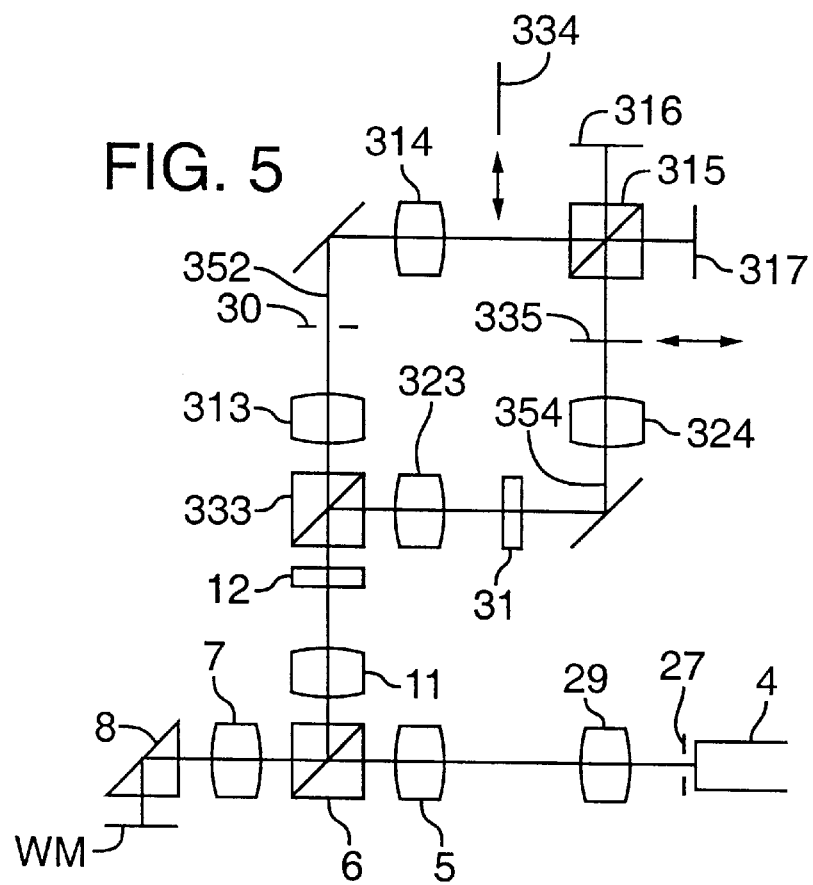
FIG. 5 is a schematic elevational view of a position detector according to Example Embodiment 4.

With reference to FIG. 5, a position detector according to Example Embodiment 4 comprises a beamsplitter 333. The alignment light flux AL exits the light guide 4 and is transmitted by the aperture stop 27, the lenses 5, 29, the beamsplitter 6, and the lens 7 to the prism 8 that directs the alignment flux AL to the alignment marks WM. The alignment flux AL from the alignment marks WM returns through the prism 8 and the lens 7 to the beamsplitter 6 that directs the alignment flux AL to the lens 11 and the reference-mark plate 12. The beamsplitter 333 directs the alignment flux AL along a bright-field optical path 352 and a phase-contrast optical path 354. The alignment flux AL propagating along the bright-field optical path 352 is transmitted by the beamsplitter 333 to a relay lens 313, the imaging aperture stop 30, and a relay lens 314 to a beamsplitter 315. The aperture stop 30 is approximately conjugate with the aperture stop 27. The beamsplitter 315 directs portions of the alignment flux AL to the Y-direction CCD 317 and the X-direction CCD 316.

The flux directed along the phase-contrast optical path 354 is transmitted by a relay lens 323 and the phase plate 31. A turning mirror 323 then reflects the flux to a relay lens 324 and the beamsplitter 315. The beamsplitter 351 then directs portions of the flux to the CCDs 316, 317.

Shutters 334, 335 are provided for selecting either a bright-field image from the alignment flux propagating along the bright-field optical path 352 or a phase-contrast image from the alignment flux propagating along the phase-contrast optical path 354 to be received by the CCDs 316, 317. A bright-field image is selected by inserting the shutter 335 to block the alignment light flux AL between the relay lens 324 and the beamsplitter 315. A phase-contrast image is selected by inserting the shutter 334 between the relay lens 324 and the beamsplitter 315. Because switching from a bright-field image to phase-contrast image is accomplished by selectively blocking the alignment flux AL along either of the axes 352, 354, no image errors are introduced.

Example Embodiment 5

Figure 6:
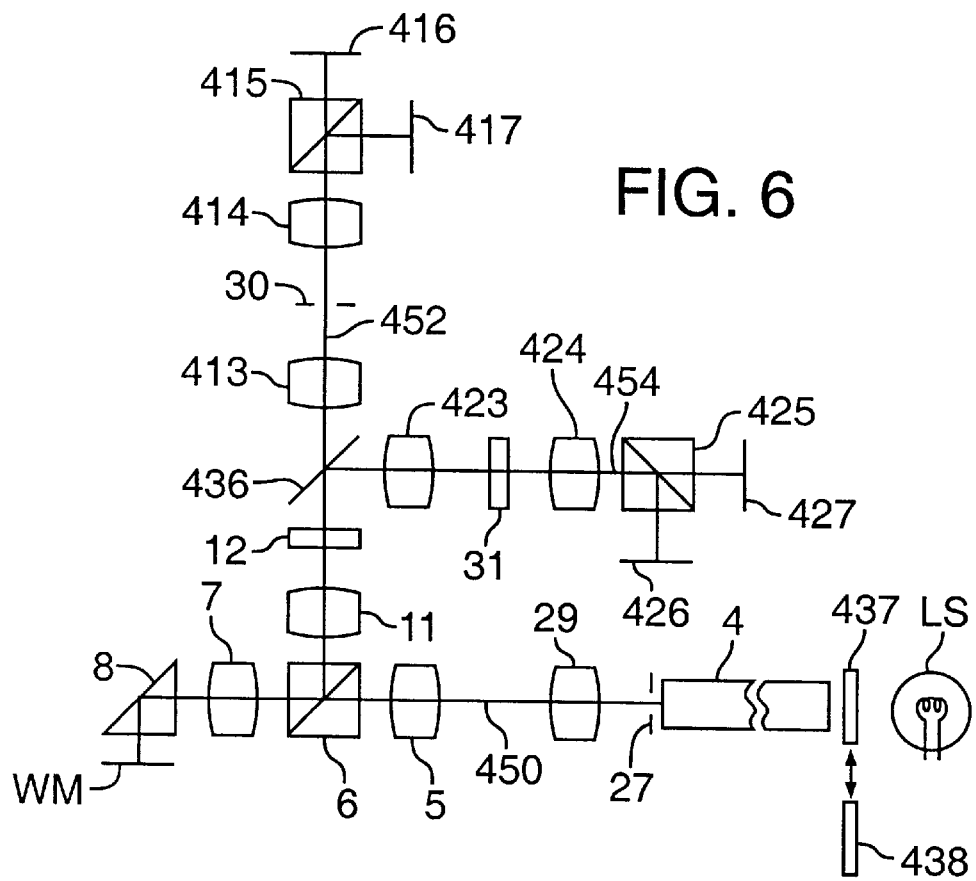
FIG. 6 is a schematic elevational view of a position detector according to Example Embodiment 5.

With reference to FIG. 6, a position detector according to Example Embodiment 5 comprises filters 437, 438 and a dichroic mirror 436. The position detector is similar to that of Example Embodiment 2. The filters 437, 438 preferably provide a long wavelength flux and a short wavelength flux respectively.

With reference to FIG. 6, a light source LS provides a light flux that is filtered by a selected one of the filters 437, 438. The filtered light flux is delivered to the light guide 4 and apertured by the aperture stop 27. The flux propagates along an axis 450 through the lens 5, the beamsplitter 6, the lens 7, and the prism 8 to the alignment marks WM. The light flux from the alignment marks WM is directed by the prism 8 to the lens 7, the beamsplitter 8, and the lens 11 to the reference-mark plate 12.

If the long-wavelength flux is selected by filter 437, then the dichroic mirror 436 transmits the long-wavelength flux along a bright-field optical path 452 to a relay lens 413, the aperture stop 30, and a relay lens 414 to a beamsplitter 415. Bright-field images of the alignment marks WM are then formed on a Y-direction CCD 417 and an X-direction CCD 416.

If the filter 438 is inserted instead, then the short-wavelength flux illuminates the alignment marks WM. The short-wavelength flux is reflected by the dichroic mirror 436 along a phase-contrast optical path 454 through a relay lens 423, the phase plate 31, and a relay lens 424 to a beamsplitter 425. The phase plate 31 is located approximately conjugate to the aperture stop 27. Phase-contrast images of the alignment marks WM are then formed on a Y-direction CCD 426 and an X-direction CCD 427.

The filters 437, 438 divide the light flux from the light source LS into a long-wavelength flux and a short-wavelength flux. The main controller 25 selects one of the filters 437, 438 for insertion and the alignment marks WM are illuminated by the corresponding wavelength flux. In Example Embodiment 5, the filters 437, 438 are inserted between the light source LS and the light guide 4. It will be apparent that other configurations are suitable and that bright-field or phase-contrast images can be formed with either the short-wavelength or the long-wavelength portion of the alignment flux AL. It will also be apparent that wavelength separation can be done using only the dichroic mirror 436.

Example Embodiment 6

Figure 7:
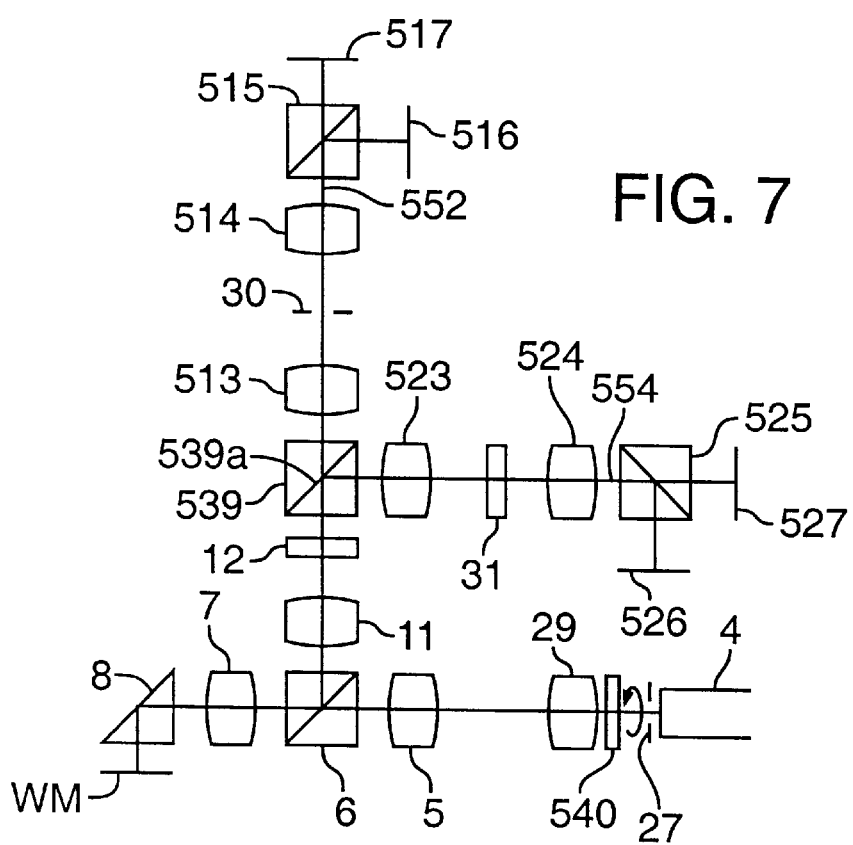
FIG. 7 is a schematic elevational view of a position detector according to Example Embodiment 6.

With reference to FIG. 7, a position detector according to Example Embodiment 6 comprises a polarizer 540 and a polarizing beamsplitter ("PBS") 539. The polarizer 540 selectively extracts a P-polarized component or an S-polarized component of the alignment flux AL from the light guide 4 and the aperture stop 27. The P-component is polarized parallel to a plane including an axis 552 and a normal to a beamsplitting surface 539a of the PBS 539; the S-component is polarized perpendicular to the P-component. The selected polarization component is directed to the alignment marks WM by the lenses 29, 5, the beamsplitter 6, the lens 7, and the prism 8. The alignment flux AL is returned from the alignment marks WM through the prism 8, the lens 7, the beamsplitter 6, and the lens 11 to the reference-mark plate 12.

The polarizing beamsplitter 539 then receives the alignment flux AL from the reference-mark plate 12 and directs the P-component and the S-component along bright-field optical path 552 and phase-contrast optical path 554. For bright-field imaging of the alignment marks WM, the polarizer 540 is oriented so that the P-component of the alignment flux is selected. The P-polarized component is transmitted by the PBS 539 along the path 552 to a relay lens 513, the aperture stop 30, and a relay lens 514 to a beamsplitter 515. The alignment marks WM are imaged onto a Y-direction CCD 516 and an X-direction CCD 517.

For phase-contrast imaging, the polarizer 540 is oriented so that the S-component is selected. The PBS 539 reflects this component along the path 554 to a relay lens 523, the phase plate 31, a relay lens 524, and a beamsplitter 525. The phase plate 31 is approximately conjugate to the aperture stop 27. Phase-contrast images of the alignment marks WM are formed on a Y-direction CCD 526 and an X-direction CCD 527.

It will be apparent that the alignment flux AL can be divided into other polarization states. Linear states other than the S- and P-polarizations can be selected. In addition, circular or elliptical polarizations can be used. In addition, it will be apparent that the PBS 539 can be used without the polarizer 540 to separate and select polarization components.

In the example embodiments, some optical components are used both to supply a light flux to the alignment marks WM and to return the flux for imaging. These elements are common to both bright-field and phase-contrast imaging. It will be apparent to those skilled in the art that separate illumination systems can be provided for bright-field imaging and phase-contrast imaging and that the imaging system and illumination system need not share optical components.

Figure 8A:
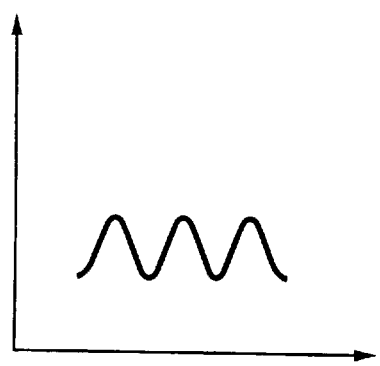
FIG. 8(a) is graph showing image-signal intensity as a function of position using a phase plate in which a phase-shift region has a reduced transmittance.
Figure 8B:
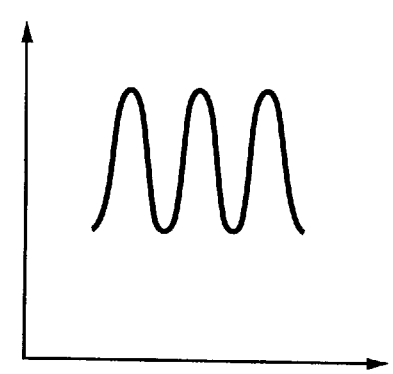
FIG. 8(b) is a graph showing image-signal intensity as a function of position obtained with a phase plate having a high transmittance in a phase-shift region.

For purposes of illustrating the image quality obtainable with the position detectors of the example embodiments, exemplary alignment marks WM are chosen to be periodic along an arbitrary coordinate axis. If the phase plate 31 has a phase-shift region 31a with a phase shift of $\pm\lambda/4$, then the intensity in an exemplary phase-contrast image as a function of position is as shown in FIG. 8(b). If the phase-shift region 31a is absorbing, then the intensity in an exemplary phase-contrast image as a function of position is as shown in FIG. 8(a). It is readily apparent that the contrast of the phase-difference image is improved by decreasing the transmittance of the phase-shift region 31a. However, because absorption by the phase-shift region 31a reduces the intensity of the light flux, the resulting image signals are smaller than with a non-absorbing phase-shift region 31a. Such image signals have a decreased signal quality. Consequently, in Example Embodiments 1–4, the phase-shift region 31a does not appreciably absorb the incident flux.

Figure 9:
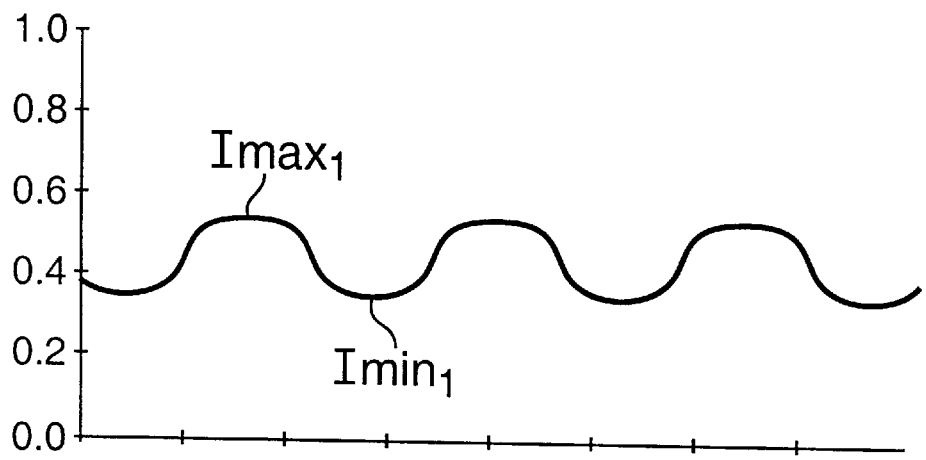
FIG. 9 is a graph showing image-signal intensity as a function of position obtained with a phase plate having a phase-shift region that is absorbing.

With reference to FIG. 9, the light-flux intensity as a function of position is plotted for a phase plate 31 in which the transmittance of the phase-shift region 31a is decreased to $T_1$=45% while the transmittance of the phase-plate aperture 31b is $T_2$=100% so that the transmittance difference $|T_1-T_2|$ is 55%. For purposes of illustration, the intensity at the various CCDs is normalized to one for the intensity obtained with bright-field imaging assuming that the alignment marks WM reflect the alignment flux AL without modulating the amplitude or phase of the alignment flux AL.

With reference to FIG. 9, $Imax_1$ is a maximum intensity, $Imin_1$ is a minimum intensity, $\Delta I_1 = Imax_1 - Imin_1$ is the modulation of the intensity, and $C_1 = \Delta I_1/(Imax_1 + Imin_1)$ is the image contrast. For the intensity plotted in FIG. 9, $Imax_1$=0.545, $Imin_1$=0.362, $\Delta I_1$=0.183, and $C_1$=0.202.

Figure 10:
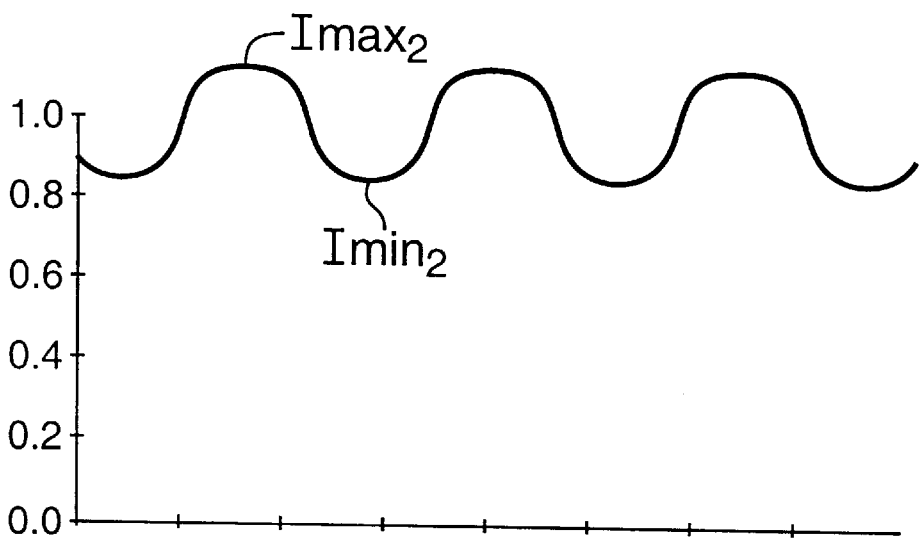
FIG. 10 is a graph showing image-signal intensity as a function of position obtained with a phase plate having a high transmittance in a phase-shift region.

With reference to FIG. 10, if the transmittances of the phase-shift region 31a and the aperture 31b are $T_1=T_2$=100%, then the difference in transmittance $|T_1-T_2|$=0. For purposes of explanation the flux intensity at the various CCDs is normalized to one for bright-field imaging of alignment marks that return the alignment flux AL without amplitude or phase modulation. With this normalization of intensity, the image intensity as a function of position is as shown in FIG. 10. In FIG. 10, the maximum intensity $Imax_2$=1.132, the minimum intensity $Imin_2$=0.859, the modulation $\Delta I_2$=0.273, and the contrast $C_2$=0.137.

It will be apparent that the image contrast of the image of FIG. 9 is greater than the image contrast of the image of FIG. 10. Therefore, direct visual observation of a phase-contrast image of the alignment marks WM is preferably done using a phase plate having some absorption to enhance image contrast. An eyepiece lens can be provided for such observation. However, if the phase-contrast image is to be detected with image detector such as a CCD and noise in the image detector is considered, then the image intensity of FIG. 10 is preferable.

For example, if the image intensities of FIGS. 9–10 are obtained with a first and a second image detector (such as CCDs 16, 17) having noises $N_1$, $N_2$, respectively, and $N_1=N_2$=0.02, then signal-to-noise (S/N) ratios of the image signals of FIGS. 9–10 are $(S/N)_1$, $(S/N)_2$, respectively, given by:

$(S/N)_1 = \Delta I_1/N_1 = 9.15$ $(S/N)_2 = \Delta I_2/N_2 = 13.65$

The image intensity of FIG. 10 thus permits more accurate position determination of the alignment marks WM because the $(S/N)_2$ is larger than $(S/N)_1$. Even if these image signals are electrically amplified, the respective signal-to-noise ratios are not improved thereby.

For imaging thin alignment marks WM, the transmittances of the phase plate 31 preferably satisfy the conditions:

$T_1 > 0.7$ $|T_1-T_2| < 0.3$.

In addition, in the example embodiments it is preferable that the aperture plate 30e be provided with the phase-shift region 31a. The aperture plate 31a permits improved alignment between the aperture stop 30 and the phase plate 31. The alignment can be within a few tens of nanometers. If the phase plate 31 has such an aperture, the aperture stop 30 and the phase plate 31 can be accurately, compactly, and inexpensively aligned.

Whereas Example Embodiments 1–5 describe position detectors in conjunction with semiconductor microlithography, it will be appreciated that position detectors according to the invention are applicable to aligning other workpieces with patterns to be transferred, especially workpieces having thin alignment marks.

While the example embodiments are described with reference to phase-contrast imaging of thin alignment marks that provide phase modulation of the alignment flux, alignment marks providing amplitude modulation can also be so imaged.

In addition, in the example embodiments the alignment flux AL is reflected from the alignment marks WM for imaging. It will be apparent that the alignment marks WM can be illuminated by an alignment light flux that is transmitted by the wafer W through the alignment marks WM.

The position detectors of the example embodiments are readily adapted for use in an alignment system in semiconductor microlithography. The position of a wafer covered with a layer of a resist is determined; based on the position determination, the wafer is then moved so as to align the wafer W and the reticle R. Position correction includes moving the wafer holder 21 and the wafer W with the XY-stage 23 and the Z-stage 22 under control of the stage controller 24 based on the position signal supplied to the main controller 25 by the signal processor 18.

As the wafer W and the reticle R are aligned, the wafer W is exposed with a lithography process, such as photolithography. The exposure process includes illuminating the reticle R with the illumination system IS. Images of the patterns on the reticle R are then formed on the wafer with the projection system PL. After exposure, the resist is developed so that the resist is patterned, generally by removing either exposed or unexposed areas of the resist. Etching or film deposition processes then use the patterns to define circuit structures. When these patterns are no longer required, the resist is removed from the wafer W. These processes are then repeated as needed to complete device fabrication. When the wafer W is fully processed, the wafer W is diced into separate integrated circuits, electrical connections are bonded to the integrated circuits, and the integrated circuits are packaged.

The example embodiments as described above are applied to the registration of reticles and masks for semiconductor microlithography for integrated circuits, but are readily applicable to the manufacture of other devices such as liquid crystal displays, thin-film magnetic heads, and image sensors.

Having illustrated and demonstrated the principles of the invention in multiple example embodiments, it should be apparent to those skilled in the art that these example embodiments can be modified in arrangement and detail without departing from such principles. I claim as the invention all that comes within the scope of these claims.

What is claimed is:

1. A position detector for measuring the position of a workpiece having alignment marks, comprising:
   (a) an illumination optical system for illuminating the alignment marks with an alignment light flux, the illumination optical system comprising an illumination aperture stop;
   (b) an imaging optical system that receives the alignment flux from the alignment marks and forms an image of the alignment marks, the imaging optical system comprising an imaging aperture stop;
   (c) a phase plate positionable conjugate to the illumination aperture stop and having a phase-shift region and defining a phase-plate aperture, the phase plate providing a phase shift between a portion of the alignment flux from the alignment marks transmitted through the phase-shift region that corresponds to an image of the illumination aperture stop and a portion of the alignment flux transmitted through the phase-plate aperture; and
   (d) a selector operable with the phase plate for selecting a phase-contrast image of the alignment marks.

2. The position detector of claim 1, wherein the selector inserts the phase plate at a location conjugate to the illumination aperture stop.

3. The position detector of claim 1, wherein:
   the phase plate is located conjugate to the illumination aperture stop; and
   the selector selects the phase-contrast image of the alignment marks by adjusting the relative phase shift of the phase-shift region and the phase plate aperture.

4. The position detector of claim 1, further comprising:
   an image detector that receives the image of the alignment marks formed by the imaging optical system and produces an image signal at an image-signal output; and
   a signal processor that receives the image signal and determines the position of the workpiece based on the image signal.

5. The position detector of claim 4, wherein the signal processor produces a position signal.

6. The position detector of claim 1, wherein the illumination aperture stop is circular.

7. The position detector of claim 6, wherein the phase-plate aperture is a circular ring surrounding the phase-shift region.

8. The position detector of claim 1, wherein the selector electrically changes the phase shift provided by the phase-shift region to a first phase difference for phase-contrast detection and a second phase difference for bright-field detection.

9. The position detector of claim 8, wherein the second phase difference is zero.

10. A position detector for measuring the position of a workpiece having alignment marks, comprising:
    (a) an illumination optical system for illuminating the alignment marks with an alignment light flux, the illumination optical system comprising an illumination aperture stop;
    (b) a switchable mirror that is insertable to receive the alignment flux from the alignment marks;
    (c) a bright-field optical system, selectable by the switchable mirror, that receives the alignment flux and comprises an imaging optical system and an imaging aperture stop for forming a bright-field image;
    (d) a phase-contrast optical system, selectable by the switchable mirror, that receives the alignment flux and comprises an imaging system and a phase plate for forming a phase-contrast image;
    (e) a selector for switching between bright-field imaging and phase-contrast imaging and that controls the switchable mirror.

11. The position detector of claim 10, wherein the phase plate is located conjugate to the illumination aperture stop and defines a phase-shift region and a phase-plate aperture, the phase plate providing a phase shift between a portion of the alignment flux from the alignment marks transmitted through the phase-shift region that corresponds to an image of the aperture stop and a portion of the alignment flux transmitted through the phase-plate aperture, wherein the imaging aperture stop is conjugate to the illumination aperture stop.

12. The position detector of claim 11, further comprising:
    a first image sensor for selectably receiving a bright-field image and producing a bright-field image signal; and
    a second image sensor for receiving a phase-contrast image and producing a phase-contrast image signal.

13. The position detector of claim 12, further comprising a signal processor that receives the bright-field image signal and the phase-contrast image signal, and that produces a position signal.

14. A position detector for measuring the position of a workpiece having alignment marks, comprising:
    (a) an illumination optical system for illuminating the alignment marks with an alignment light flux, the illumination optical system comprising an illumination aperture stop;
    (b) a bright-field optical system comprising an imaging optical system and an imaging aperture stop for forming a bright-field image of the alignment marks;
    (c) a phase-contrast optical system comprising an imaging optical system and a phase plate for forming a phase-contrast image;
    (d) a beamsplitter that receives the alignment flux from the alignment marks and directs the alignment flux to the bright-field optical system and the phase-contrast optical system.

15. The position detector of claim 14, wherein the phase plate is located conjugate to the illumination aperture stop and defines a phase-shift region and a phase-plate aperture, the phase plate providing a phase shift between a portion of the alignment flux from the alignment marks transmitted through the phase-shift region that corresponds to an image of the aperture stop and a portion of the alignment flux transmitted through the phase-plate aperture, wherein the imaging aperture stop is conjugate to the illumination aperture stop.

16. The position detector of claim 15, further comprising an image sensor for receiving the bright-field image and the phase-contrast image; and
    a selector for switching between bright-field imaging and phase-contrast imaging.

17. The position detector of claim 16, further comprising:
    a first shutter for blocking the portion of the alignment flux in the bright-field optical system; and
    a second shutter for blocking the portion of the alignment flux in the phase-contrast optical system.

18. The position detector of claim 15, further comprising:
    a first image sensor that receives the bright-field image;
    a second image sensor that receives the phase-contrast image; and
    a selector for selecting the bright-field image or the phase-contrast image.

19. The position detector of claim 14, wherein the beamsplitter is a polarizing beamsplitter.

20. The position detector of claim 14, wherein the beamsplitter is a dichroic mirror.

21. The position detector of claim 1, further comprising a reference-mark plate placed conjugate to the alignment marks.

22. An exposure device for exposing a sensitized substrate to patterns on a reticle, comprising:
 (a) a position detector comprising:
  (1) an illumination optical system that illuminates alignment marks on the substrate with an alignment flux, the illumination system comprising an illumination aperture stop;
  (2) an imaging system that receives the alignment flux and forms an image of the alignment marks;
  (3) an imaging detector that receives the image and provides an image signal;
  (4) a phase plate located conjugate to the illumination aperture stop and defining a phase-shift region and phase-plate aperture, the phase plate providing a phase shift between a portion of the alignment flux from the alignment marks transmitted through the phase-shift region that corresponds to an image of the aperture stop and a portion of the alignment flux transmitted through the phase-plate aperture; and
  (5) a selector that inserts and withdraws the phase plate to switch between bright-field imaging and phase-contrast imaging;
 (b) an illumination system for illuminating the reticle;
 (c) a projection system for forming an image of the reticle on the substrate; and
 (d) a stage for translating the substrate.

23. The exposure apparatus of claim 22, further comprising a controller that translates the substrate based on the image signal.

24. An apparatus for observing a wafer, comprising:
 (a) an illumination optical system comprising an illumination aperture stop, the illumination optical system producing an alignment flux that illuminates the wafer;
 (b) an imaging system that forms an image of the wafer, the imaging system comprising an imaging aperture stop and a phase plate, the imaging aperture stop and the phase plate being located conjugate to the illumination aperture stop, the phase plate defining a phase-shift region and a phase-plate aperture, the phase plate providing a phase shift between a portion of the alignment flux from the alignment marks transmitted through the phase-shift region that corresponds to an image of the illumination aperture stop and a portion of the alignment flux transmitted through the phase-plate aperture; and
 (c) a selector for controlling the insertion of the phase plate.

25. The apparatus of claim 24, wherein the phase-shift region of the phase plate has a transmission $T_1$ and the phase-shift aperture has a transmission $T_2$, wherein $T_1$ and $T_2$ satisfy the conditions $T_1 > 0.7$ and $|T_1 - T_2| < 0.3$.

26. A method for exposing a sensitized substrate having alignment marks corresponding to patterns on a reticle, comprising:
 (a) exposing the reticle with an exposure flux and forming an image of the reticle on the substrate with the exposure flux;
 (b) illuminating the alignment marks with an alignment flux;
 (c) obstructing a diffracted portion of the alignment flux at a imaging aperture plane and forming a bright-field image of the alignment marks with an unobstructed portion;
 (d) determining a conjugate location to the imaging aperture plane;
 (e) phase-shifting an undiffracted portion of the alignment flux relative to a diffracted portion at the conjugate location;
 (f) forming a phase-contrast image of the alignment marks with the undiffracted and diffracted portions after phase-shifting; and
 (g) selecting the bright-field image or the phase-contrast image of the alignment marks;
 (h) adjusting the relative positions of the reticle and the sensitized substrate based on the selected image; and
 (i) exposing the sensitized substrate to the pattern on the reticle.

27. The method of claim 26, further comprising:
 providing an image signal from the selected image of the alignment marks; and
 providing a position signal based on the image signal.

28. The method of claim 26, further comprising:
 providing an image signal from the bright-field image; and
 providing am image signal from the phase-contrast image.

29. The method of claim 27, further comprising moving the substrate with respect to the reticle based on the image signal.

* * * * *